United States Patent
Rozenzon et al.

(10) Patent No.: US 10,163,606 B2
(45) Date of Patent: Dec. 25, 2018

(54) PLASMA REACTOR WITH HIGHLY SYMMETRICAL FOUR-FOLD GAS INJECTION

(71) Applicant: APPLIED MATERIALS, INC., Santa Clara, CA (US)

(72) Inventors: Yan Rozenzon, San Carlos, CA (US); Kyle Tantiwong, Livermore, CA (US); Imad Yousif, San Jose, CA (US); Vladimir Knyazik, Santa Clara, CA (US); Bojenna Keating, Palo Alto, CA (US); Samer Banna, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 532 days.

(21) Appl. No.: 14/762,224

(22) PCT Filed: Feb. 3, 2014

(86) PCT No.: PCT/US2014/014391
§ 371 (c)(1),
(2) Date: Jul. 21, 2015

(87) PCT Pub. No.: WO2014/149200
PCT Pub. Date: Sep. 25, 2014

(65) Prior Publication Data
US 2015/0371826 A1 Dec. 24, 2015

Related U.S. Application Data

(60) Provisional application No. 61/789,485, filed on Mar. 15, 2013.

(51) Int. Cl.
*H01J 37/32* (2006.01)
*C23C 16/455* (2006.01)

(52) U.S. Cl.
CPC ...... *H01J 37/3244* (2013.01); *C23C 16/4558* (2013.01); *C23C 16/45561* (2013.01); *C23C 16/45578* (2013.01); *H01J 37/32082* (2013.01)

(58) Field of Classification Search
CPC ............ H01J 37/3244; H01J 37/32082; C23C 16/45561; C23C 16/45578; C23C 16/4558
See application file for complete search history.

(56) References Cited

U.S. PATENT DOCUMENTS

| | | | |
|---|---|---|---|
| 5,571,366 A | 11/1996 | Ishii | |
| 5,620,523 A | 4/1997 | Maeda et al. | |

(Continued)

FOREIGN PATENT DOCUMENTS

| | | |
|---|---|---|
| CN | 101604624 A | 12/2009 |
| CN | 102034666 A | 4/2011 |

(Continued)

OTHER PUBLICATIONS

U.S. Appl. No. 13/966,614, filed Aug. 14, 2013, Carducci et al.
(Continued)

*Primary Examiner* — Jeffrie R Lund
(74) *Attorney, Agent, or Firm* — Fish & Richardson P.C.

(57) ABSTRACT

An annular lid plate of a plasma reactor has upper and lower layers of gas distribution channels distributing gas along equal length paths from gas supply lines to respective gas distribution passages of a ceiling gas nozzle.

20 Claims, 7 Drawing Sheets

(56) References Cited

U.S. PATENT DOCUMENTS

| | | | |
|---|---|---|---|
| 5,792,272 A | 8/1998 | Van Os et al. |
| 5,897,713 A | 4/1999 | Tomioka et al. |
| 5,948,704 A | 9/1999 | Benjamin et al. |
| 6,024,826 A | 2/2000 | Collins |
| 6,051,073 A | 4/2000 | Chu |
| 6,083,344 A | 7/2000 | Hanawa et al. |
| 6,089,182 A | 7/2000 | Hama |
| 6,129,808 A | 10/2000 | Wicker et al. |
| 6,200,412 B1 | 3/2001 | Kilgore et al. |
| 6,326,597 B1 | 12/2001 | Lubomirsky |
| 6,367,410 B1 | 4/2002 | Leahey |
| 6,414,648 B1 | 7/2002 | Holland |
| 6,450,117 B1 | 9/2002 | Murugeshi et al. |
| 6,451,161 B1 | 9/2002 | Jeng |
| 6,518,190 B1 | 2/2003 | Lill et al. |
| 6,527,911 B1 | 3/2003 | Yen et al. |
| 6,899,787 B2 | 5/2005 | Nakano |
| 7,785,417 B2 | 8/2010 | Ni et al. |
| 7,832,354 B2* | 11/2010 | Katz ............ H01J 37/3244 118/723 R |
| 7,976,671 B2 | 7/2011 | Chandrachood et al. |
| 8,017,029 B2 | 9/2011 | Chandrachood et al. |
| 8,025,731 B2 | 9/2011 | Ni et al. |
| 8,858,754 B2 | 10/2014 | Horiguchi et al. |
| 8,933,628 B2 | 1/2015 | Banna et al. |
| 9,017,481 B1* | 4/2015 | Pettinger ......... H01J 37/3244 118/715 |
| 9,076,634 B2 | 7/2015 | Brown et al. |
| 9,218,944 B2 | 12/2015 | Chandrachood et al. |
| 9,892,908 B2* | 2/2018 | Pettinger ......... H01L 21/02104 |
| 2001/0019048 A1 | 9/2001 | Ose |
| 2002/0023896 A1 | 2/2002 | Tachino et al. |
| 2002/0038791 A1 | 4/2002 | Okumura et al. |
| 2002/0121345 A1 | 9/2002 | Chen |
| 2003/0213434 A1 | 11/2003 | Gondhalekar |
| 2004/0083971 A1 | 5/2004 | Holland et al. |
| 2004/0134611 A1* | 7/2004 | Kato ............... C23C 16/455 156/345.33 |
| 2005/0178747 A1 | 8/2005 | Shibamoto |
| 2005/0178748 A1 | 8/2005 | Buchberger, Jr. et al. |
| 2005/0252885 A1 | 11/2005 | Tachino et al. |
| 2005/0257743 A1 | 11/2005 | Koshiishi et al. |
| 2007/0023145 A1 | 2/2007 | Bera et al. |
| 2009/0056629 A1* | 3/2009 | Katz ............... H01J 37/3244 118/723 R |
| 2009/0057269 A1* | 3/2009 | Katz ............... H01J 37/3244 216/67 |
| 2009/0159213 A1 | 6/2009 | Bera et al. |
| 2009/0159425 A1 | 6/2009 | Liu et al. |
| 2009/0162262 A1 | 6/2009 | Bera et al. |
| 2009/0250169 A1 | 10/2009 | Carducci et al. |
| 2009/0272492 A1 | 11/2009 | Katz et al. |
| 2009/0294065 A1 | 12/2009 | Lai |
| 2010/0101728 A1* | 4/2010 | Iwasaki ........... H01J 37/32192 156/345.33 |
| 2010/0132615 A1 | 6/2010 | Kato et al. |
| 2011/0056626 A1* | 3/2011 | Brown ............ H01J 37/321 156/345.33 |
| 2011/0094996 A1 | 4/2011 | Yamazawa et al. |
| 2011/0222038 A1 | 9/2011 | Yamashita et al. |
| 2011/0223334 A1* | 9/2011 | Yudovsky ........ C23C 16/45504 427/255.23 |
| 2012/0073756 A1 | 3/2012 | Yamazawa |
| 2012/0090990 A1 | 4/2012 | Cox |
| 2012/0248066 A1 | 10/2012 | Yamazawa |
| 2013/0256271 A1 | 10/2013 | Panagopoulos et al. |
| 2013/0278141 A1 | 10/2013 | Dorf et al. |
| 2013/0278142 A1 | 10/2013 | Dorf et al. |
| 2013/0284370 A1 | 10/2013 | Collins et al. |
| 2014/0020839 A1* | 1/2014 | Kenney ........... H01J 37/04 156/345.48 |
| 2014/0237840 A1 | 8/2014 | Knyazik et al. |
| 2015/0068682 A1 | 3/2015 | Banna et al. |
| 2015/0087157 A1 | 3/2015 | Aubuchon et al. |
| 2015/0279621 A1 | 10/2015 | Brown et al. |
| 2015/0371826 A1 | 12/2015 | Rozenzon et al. |
| 2015/0371831 A1 | 12/2015 | Rozenzon et al. |
| 2016/0042917 A1 | 2/2016 | Chandrachood et al. |
| 2018/0211811 A1* | 7/2018 | Kenney ........... H01J 37/04 |
| 2018/0218873 A1* | 8/2018 | Kenney ........... H01J 37/04 |

FOREIGN PATENT DOCUMENTS

| | | |
|---|---|---|
| CN | 102204415 A | 9/2011 |
| JP | 11-514499 | 12/1999 |
| JP | 2004-172622 | 6/2004 |
| JP | 2004-200429 | 7/2004 |
| JP | 2009-302324 | 12/2009 |
| KR | 10-2004-0102300 | 12/2004 |
| KR | 10-2009-0102257 | 9/2009 |
| TW | 201006955 | 2/2010 |
| WO | WO 2008/088110 | 7/2008 |

OTHER PUBLICATIONS

U.S. Appl. No. 13/897,592, filed May 20, 2013, Kenney et al.
U.S. Appl. No. 13/897,585, filed May 20, 2013, Kenney et al.
U.S. Appl. No. 13/666,245, filed Nov. 1, 2012, Nguyen et al.
U.S. Appl. No. 13/666,224, filed Nov. 1, 2012, Nguyen et al.
U.S. Appl. No. 13/629,267, filed Sep. 27, 2012, Carducci et al.
U.S. Appl. No. 14/319,089, filed Jun. 30, 2014, Carducci et al.
U.S. Appl. No. 14/294,431, filed Jun. 3, 2014, Kenney et al.
U.S. Appl. No. 14/270,578, filed May 6, 2014, Nguyen et al.
International Search Report and Written Opinion in International Application No. PCT/US2014/014391, dated May 19, 2014, 11 pages.
U.S. Appl. No. 60/887,774, Unpublished (filed Feb. 1, 2007) (Madhavi R. Chandrachood, et al., inventor).
Japanese Office Action in Japanese Application No. 2016-500195, dated Sep. 27, 2017, 9 pages (English Translation).

* cited by examiner

PLASMA REACTOR WITH HIGHLY SYMMETRICAL FOUR-FOLD GAS INJECTION

BACKGROUND

Technical Field

The disclosure pertains to a gas injection system for a plasma reactor employed in processing a workpiece such as a semiconductor wafer.

Background Discussion

Control of process gas distribution in the chamber of a plasma reactor affects process control of etch rate distribution or deposition rate distribution on a workpiece during plasma processing. A tunable gas injection nozzle mounted on the chamber ceiling may have different injection slits directed to different zones, such as a center zone and a side zone. Separate gas inputs may feed the different injection slits, and separate flow rate control may be provided for each gas input. Each gas input may feed different portions of the corresponding injection slit through different gas flow paths. It is desirable that the different gas flow paths from a particular gas input be of equal lengths, for the sake of uniformity. However, it has not seemed possible to make the gas input-to-nozzle path lengths equal for all inputs and nozzles, leading to non-uniformities in gas distribution.

SUMMARY

An annular lid plate in a gas delivery system for a plasma reactor chamber with a gas nozzle of inner and outer gas injection passages. The annular lid plate defines a central opening and comprises: (a) first and second pluralities of gas outlets coupled to respective ones of the inner and outer gas injection passages, the gas outlets in each of the first and second pluralities of gas outlets being spaced apart by a first arc length, (b) a gas delivery block comprising first and second gas supply passages and (c) first and second pluralities of gas distribution channels in respective upper and lower levels. Each of the first and second pluralities of gas distribution channels comprises: (a) an arcuate gas delivery channel having a pair of ends connected to a corresponding pair of the gas outlets, and (b) an arcuate gas supply channel comprising an input end connected to a corresponding one of the first and second gas supply passages, and an output end coupled to a middle zone of the arcuate gas delivery channel.

In an embodiment, the gas delivery block is disposed at a location that is offset from the output end of each of the gas supply channels by a second arc length such that the gas supply channels of the first and second pluralities of gas distribution channels are of the same length.

In an embodiment, the gas outlets of the first and second pluralities of gas outlets are distributed with respect to a circumference of the annular lid plate, and the first plurality of gas outlet alternates with the second plurality of gas outlets along the circumference.

In a related embodiment, the first plurality of gas outlets comprises a first pair of gas outlets and the arc length corresponds to a half circle, and the second plurality of gas outlets comprises a second pair of gas outlets offset from the first pair of gas outlets by a quarter circle.

In a further related embodiment, the gas delivery block is disposed at a location that is offset from the output end of each of the gas supply channels by an arc length of a quarter circle.

In one embodiment, each of the first and second pluralities of gas distribution channels further comprises a flow transition element connected between the output end of the gas supply channel and the middle zone of the gas delivery channel. The flow transition element comprises: (a) a radial transition conduit, (b) an axial input conduit coupled between the output end of the gas supply channel and one end of the radial transition conduit, and (c) an axial output conduit connected between the middle zone of the gas feed channel and the other end of the radial transition conduit.

In an embodiment, the axial input conduit meets an opening in the output end of the gas supply channel, and the axial output conduit meets an opening in the middle zone of the gas feed channel.

In a further embodiment, the gas nozzle comprises: (a) a first plurality of radial elevated feed lines having respective input ends coupled to respective ones of the first plurality of gas outlets and respective output ends overlying the inner gas injection passage, (b) a second plurality of radial elevated feed lines having respective input ends coupled to respective ones of the second plurality of gas outlets and respective output ends overlying the inner gas injection passage, (c) a first plurality of axial drop lines connected between the respective output ends and the inner gas injection passages, (d) a second plurality of axial drop lines connected between the respective output ends and the outer gas injection passages.

In a related embodiment, (a) the first plurality of axial drop lines intersect the inner gas injection passage at respective drop points evenly spaced along the inner gas injection passage, and (b) the second plurality of axial drop lines intersect the outer gas injection passage at respective drop points evenly spaced along the outer gas injection passage.

In a related embodiment, the gas nozzle further comprises: (a) a first plurality of supply ports evenly spaced around a periphery of the gas nozzle and connected to respective ones of the first plurality of gas outlets, (b) a second plurality of supply ports evenly spaced around a periphery of the gas nozzle and connected to respective ones of the second plurality of gas outlets, and offset from the first plurality of supply ports, (c) wherein the first plurality of supply ports are connected to respective pairs of the first plurality of radial elevated feed lines, and the second plurality of supply ports are connected to respective pairs of the second plurality of radial elevated feed lines.

In related embodiment further comprises: (a) a first plurality of radial gas delivery conduits connected between respective ones of the first plurality of gas outlets and the first plurality of supply ports, and (b) a second plurality of radial gas delivery conduits connected between respective ones of the second plurality of gas outlets and the second plurality of supply ports.

In accordance with a related aspect, an annular lid plate for a plasma reactor comprises: (a) first and second pluralities of gas outlets, the gas outlets in each of the first and second pluralities of gas outlets being spaced apart by a first arc length, (b) a gas delivery block comprising first and second gas supply passages, (c) first and second pluralities of gas distribution channels in respective upper and lower levels. Each of the first and second pluralities of gas distribution channels comprises: (a) an arcuate gas delivery channel having a pair of ends connected to a corresponding pair of the gas outlets, and (b) an arcuate gas supply channel comprising an input end connected to a corresponding one of the first and second gas supply passages, and an output end coupled to a middle zone of the arcuate gas delivery channel.

In one embodiment of the annular lid plate, the gas delivery block is disposed at a location that is offset from the output end of each of the gas supply channels by a second arc length such that the gas supply channels of the first and second pluralities of gas delivery channels are of the same length.

In a one embodiment of the annular lid plate, the gas outlets of the first and second pluralities of gas outlets are distributed with respect to a circumference of the annular lid plate, and wherein the first plurality of gas outlet alternates with the second plurality of gas outlets along the circumference.

In a related embodiment of the annular lid plate, the first plurality of gas outlets comprises a first pair of gas outlets and the arc length corresponds to a half circle, and the second plurality of gas outlets comprises a second pair of gas outlets offset from the first pair of gas outlets by a quarter circle.

In an embodiment of the annular lid plate, the gas delivery block is disposed at a location that is offset from the output end of each of the gas supply channels by an arc length of a quarter circle.

In a further embodiment, of the annular lid plate, each of the first and second pluralities of gas distribution channels further comprises a flow transition element connected between the output end of the gas supply channel and the middle zone of the gas delivery channel. In one embodiment, the flow transition element comprises: (a) a radial transition conduit, (b) an axial input conduit coupled between the output end of the gas supply channel and one end of the radial transition conduit, and (c) an axial output conduit connected between the middle zone of the gas feed channel and the other end of the radial transition conduit.

BRIEF DESCRIPTION OF THE DRAWINGS

So that the manner in which the exemplary embodiments of the present invention are attained can be understood in detail, a more detailed description of the invention, briefly summarized above, may be obtained by reference to the embodiments thereof which are illustrated in the appended drawings. It is to be appreciated that certain well known processes are not discussed herein in order to not obscure the invention.

Figure 1A:
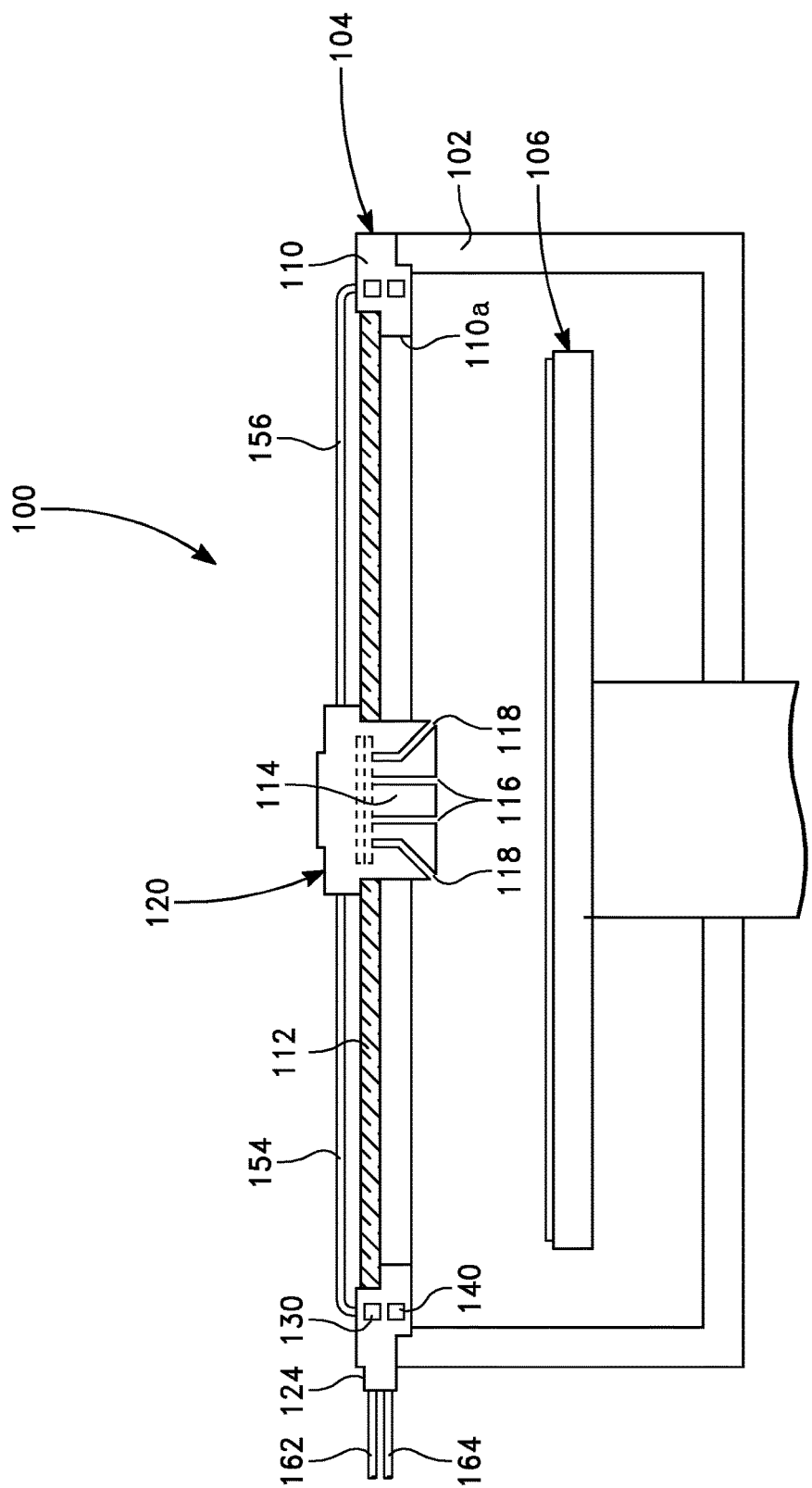
FIG. 1A is a partially cut-away elevational view of a reactor chamber in accordance with one embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

The problem to be solved involves gas delivery to injectors through gas channels formed in a lid plate of the chamber. The lid plate in some designs is annular and defines a circular center opening framing a dielectric window through which RF power is coupled into the chamber. All the gas inputs are adjacent one another at a gas supply block, complicating the gas delivery. In order that all the gas flow paths from each gas input be of equal lengths, it has been necessary for the gas channels to provide recursive paths that reverse direction abruptly. This introduces turbulence, with effects that hamper process control. Moreover, the recursive gas channels occupy a large area, requiring the annular lid plate to be of a large area, which limits the size of the dielectric window relative to the chamber, a significant problem. Further, depending upon the location of the gas supply block, the path lengths differ significantly.

The tunable gas nozzle has circular channels feeding its different injection slits. Gas feed to the tunable gas nozzle from each gas input is along a straight gas line, which must intersect the corresponding circular channel. However, the momentum of the gas fed to the circular channel is along a single direction, and therefore the gas flow from the straight-line path has a preference for a single rotational direction in the circular channel of the tunable gas nozzle. This leads to undesirable asymmetry and non-uniformity.

Embodiments described below provide gas distribution that is completely symmetrical, having uniform path lengths for all gas inputs, and having gas distribution channels without abrupt path reversals in the plane of channels, and occupying a smaller annular area. Further provided is a gas feed to the tunable gas injection nozzle that has minimal or no directional preference in the manner in which gas is introduced into the circular channels of the tunable gas injection nozzle.

Referring to FIG. 1A, a plasma reactor includes a vacuum chamber 100 enclosed by a cylindrical side wall 102 and a ceiling 104. A workpiece support pedestal 106 within the chamber 100 faces the ceiling 104. The ceiling 104 includes an annular lid plate 110 having a circular central opening 110a, and a disk-shaped dielectric window 112 framed by the central opening 110a. A tunable gas injection nozzle 114 faces into the vacuum chamber 100 through the center of the dielectric window 112 and has inner and outer circular gas injection passages 116, 118 fed by a gas distribution hub 120. The inner gas injection passages 116 are vertical and direct process gas to an inner gas injection zone, while the outer gas injection passages 118 are angled outwardly and direct process gas to an outer gas injection zone. The gas distribution hub 120 feeds the inner and outer gas injection passages 116, 118 separately, as will be described later in this specification.

Process gas is received at a gas delivery block 124 and is distributed to different ports of the gas distribution hub 120 through upper and lower groups of gas distribution channels 130, 140 inside the annular lid plate 110. The upper group of gas distribution channels 130 (FIG. 1A) are at an upper plane near a top surface of the annular lid plate 110, while the lower group of gas distribution channels 140 (FIG. 1A) are at a lower plane near a bottom surface of the annular lid plate 110.

Figure 1B:
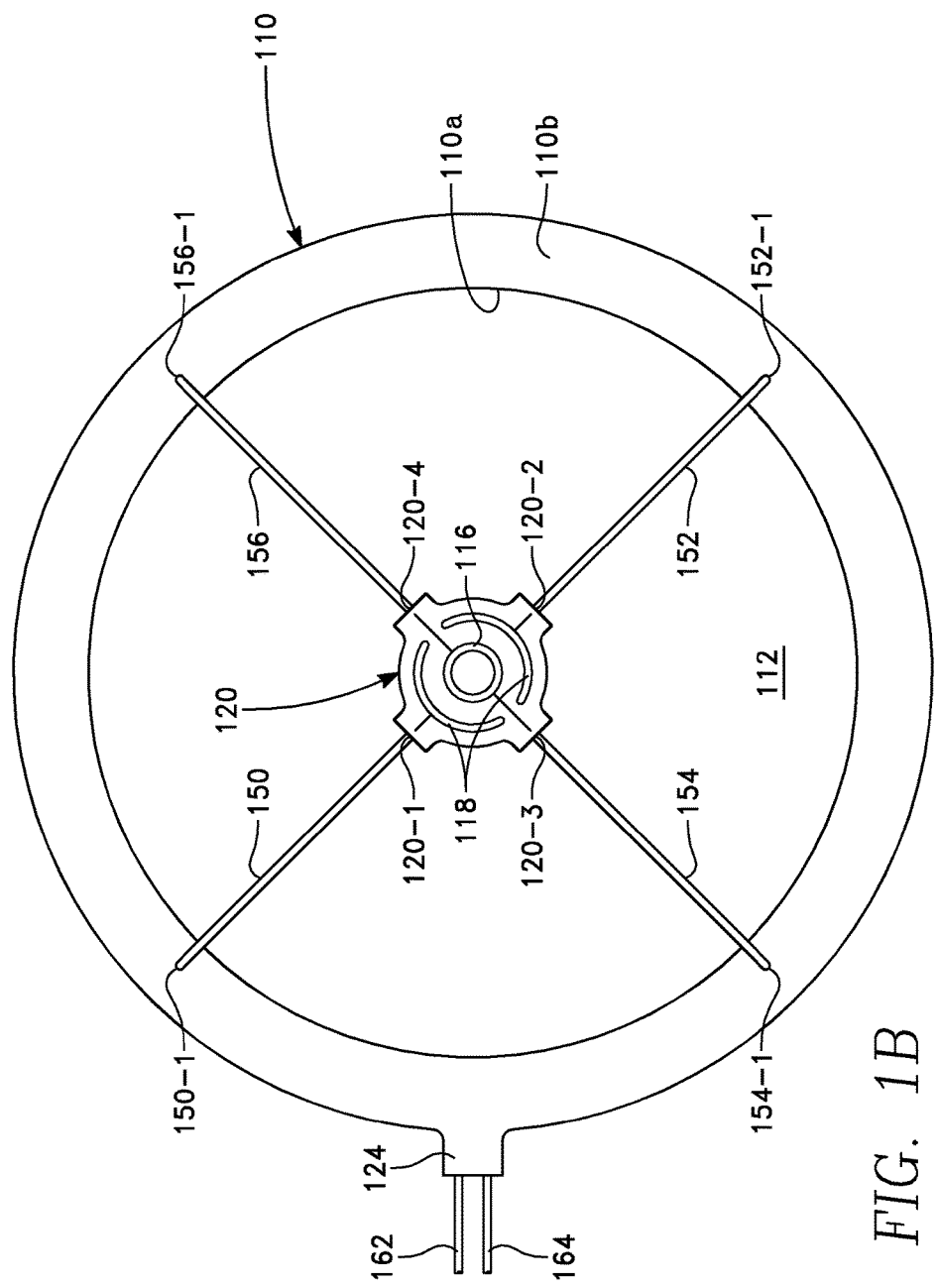
FIG. 1B is a plan view corresponding to FIG. 1A.

Referring to FIG. 1B, the gas distribution hub 120 has a first opposing pair of gas supply ports 120-1, 120-2 coupled to the outer gas injection passage 118, and a second opposing pair of gas supply ports 120-3 and 120-4 coupled to the inner gas injection passage 116. A first pair of radial gas delivery conduits 150, 152 overlying the dielectric window 112 are connected between the pair of gas supply ports 120-1, 120-2, respectively, and the upper group of gas supply channels 130 in the annular lid plate 110. A second pair of radial gas delivery conduits 154, 156 overlying the dielectric window 112 are connected between the pair of gas supply ports 120-3, 120-4, respectively, and the lower group of gas supply channels 140 in the annular lid plate 110. The gas supply ports 120-1 through 120-4 are disposed at 90 degree intervals around the periphery of the hub 120. In one embodiment, the four radial gas delivery conduits 150, 152, 154, 156 are evenly distributed at 90 degree intervals relative to the circumference of the annular lid plate 110 and extend radially.

The gas delivery block 124 extends outwardly from a peripheral edge of the annular lid plate 110, and includes an upper gas inlet 162 connected to the upper group of gas distribution channels 130 and a lower gas inlet 164 connected to the lower group of gas distribution channels 140. The gas delivery block 124 is located along the circumference of the annular lid plate 110 at a 45 degree angular position relative to the adjacent radial gas delivery conduits 150 and 154.

Figure 2:
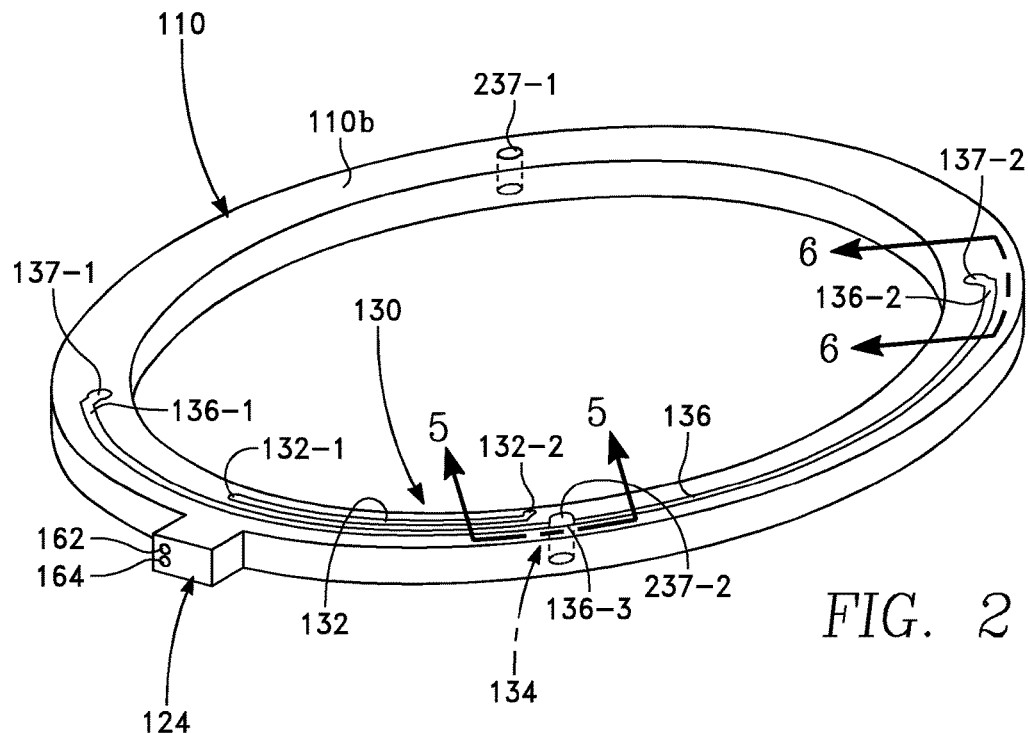
FIGS. 2 and 3A are top and bottom views, respectively, of a gas delivery lid plate of the embodiment of FIG. 1.
Figure 3A:
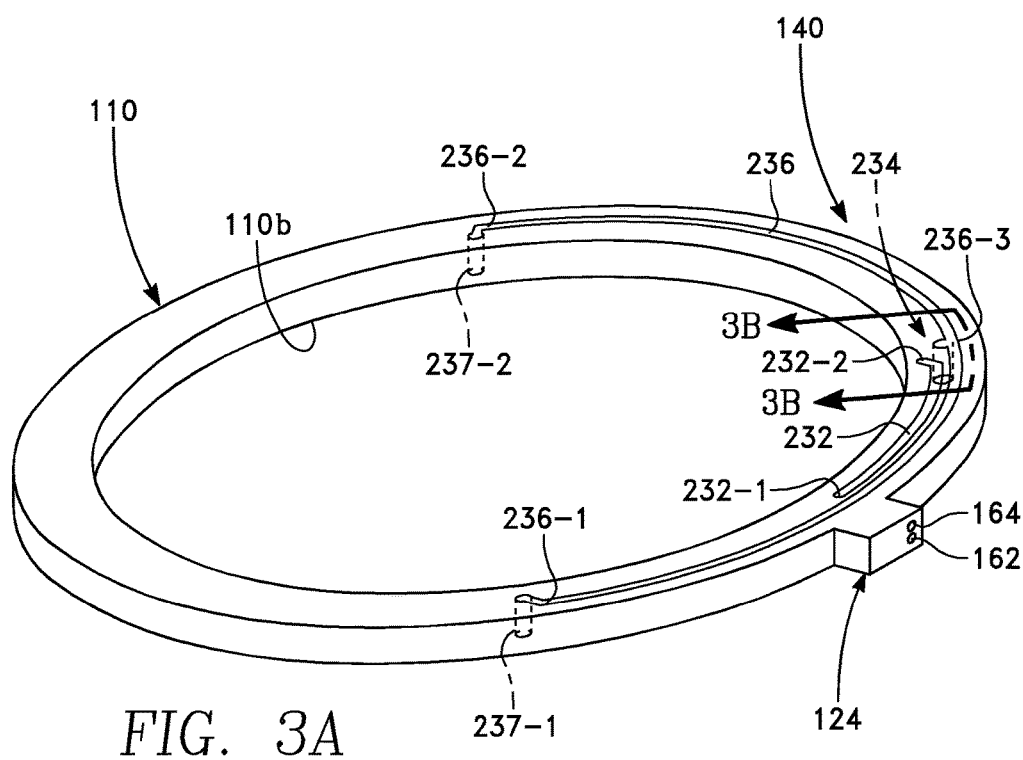

The top view of FIG. 2 best shows the upper group of gas distribution channels 130, while the bottom view of FIG. 3A best shows the lower group of gas distribution channels 140. Providing the gas channels as the upper and lower groups of gas distribution channels 130 and 140 avoids spatial constraints or conflicts between them and permits them to be symmetrically configured as mirror images of one another, leading to greater uniformity.

Figure 4:
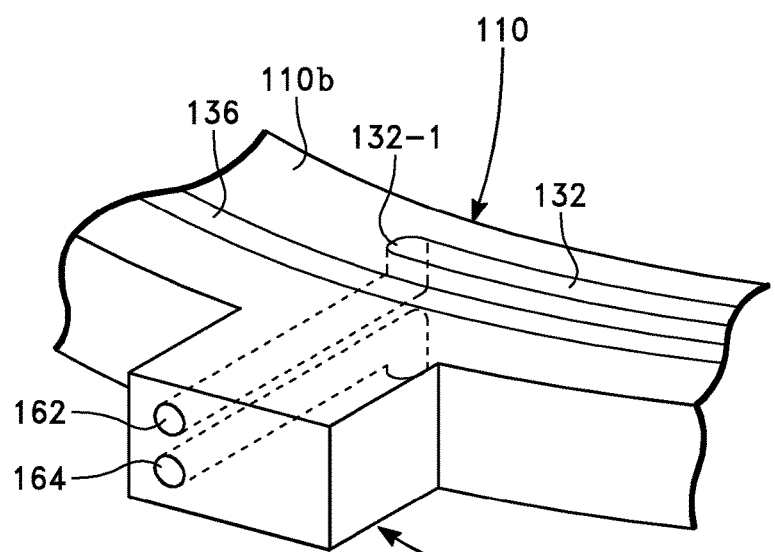
FIG. 4 is an enlarged view of a portion of FIG. 2.
Figure 5:
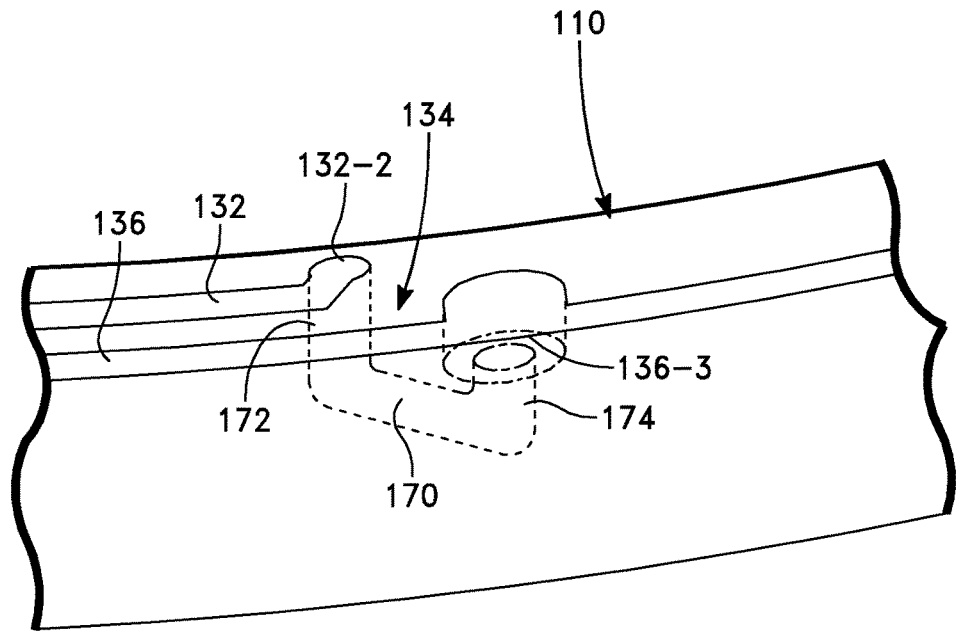
FIG. 5 is a cross-sectional view taken along lines 5-5 of FIG. 2.

The upper group of gas distribution channels 130 referred to in FIG. 1A is depicted in FIG. 2 and includes an arcuate gas supply channel 132 having an input end 132-1 coupled to the upper gas inlet 162 of the gas delivery block 124 (FIG. 4) and an outlet end 132-2 coupled to an internal flow transition element 134 shown in FIG. 5. The arcuate gas supply channel 132 subtends 45 degrees of arc between its two ends 132-1 and 132-2. The connections to the gas delivery block 124 including the upper gas inlet 162 are best shown in the enlarged view of FIG. 4.

Figure 6:
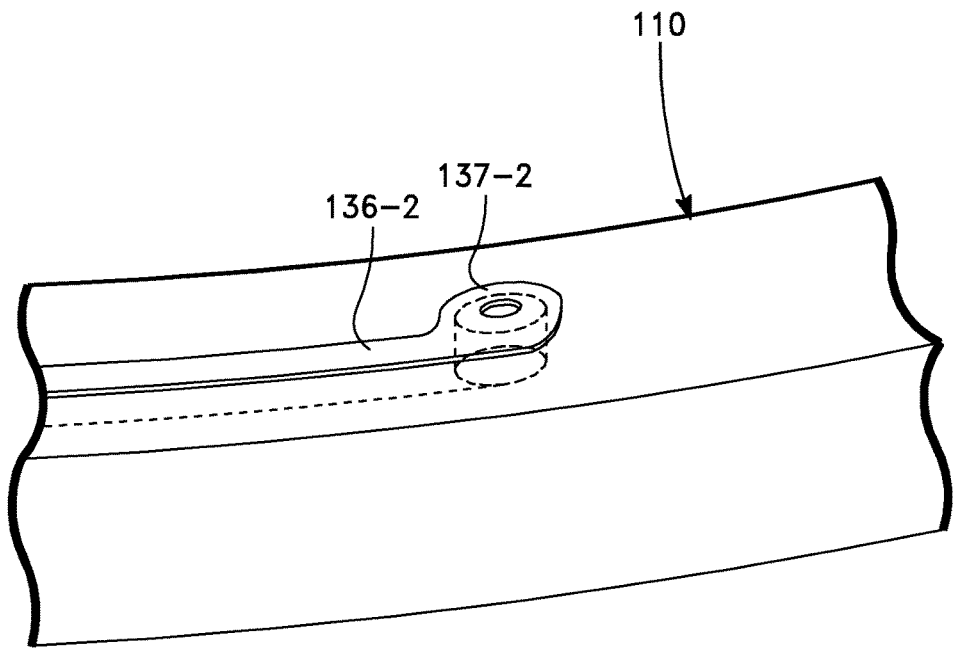
FIG. 6 is a cross-sectional view taken along lines 6-6 of FIG. 2.

The upper group of gas distribution channels 130 further includes an arcuate gas feed channel 136 subtending 180 degrees of arc between a pair of ends 136-1, 136-2. The ends 136-1 and 136-2 include axial gas openings 137-1 and 137-2, that are coupled to radially outward ends 150-1 and 152-1 of the gas conduits 150 and 152, respectively, of FIG. 1B. The axial gas opening 137-2 is shown in the enlarged view of FIG. 6. The flow transition element 134 of FIG. 5 provides a connection from the outlet end 132-2 of the gas distribution channel 132 to a middle zone 136-3 of the arcuate gas feed channel 136.

Referring to FIG. 5, the flow transition element 134 includes a radial transition conduit 170 beneath the outlet end 132-2. An axial input conduit 172 is coupled between the outlet end 132-2 of the gas supply channel 132 and one end of the radial transition conduit 170. An axial output conduit 174 is coupled between the middle zone 136-3 of the gas feed channel 136 and the other end of the radial transition conduit 170. The axial input conduit 172 meets an opening in the bottom of the outlet end 132-2 of the gas supply channel 132. The axial output conduit 174 meets an opening in the bottom of the middle zone 136-3 of the gas feed channel 136.

The gas supply channel 136 has two halves on either side of the middle zone 136-3, in which gas flow is in opposite rotational directions. A problem solved by the flow transition element 134 is how to evenly distribute gas flow in the two halves of the gas distribution channel 136 given the counterclockwise direction of gas flow in the gas supply channel 132. The axial input port 172 transforms the counter clockwise momentum distribution of the gas flow from the gas supply channel end 132-2 to an axial distribution, removing any preference for a particular rotational direction. The axial gas output port 174 enables the axial gas flow momentum to be evenly split between the opposite rotational directions in the two halves of the gas distribution channel 136. In one embodiment, this provides uniform gas distribution.

The lower group of gas distribution channels 140 referred to in FIG. 1A is depicted in FIG. 3A and includes an arcuate gas supply channel 232 having an input end 232-1 coupled to the lower gas inlet 164 of the gas delivery block 124 (FIG. 4) and an outlet end 232-2 coupled to an internal flow transition element 234 similar to the flow transition element 134 described above with reference to FIG. 5. The arcuate gas supply channel 232 subtends 45 degrees of arc between its two ends 232-1 and 232-2.

The lower group of gas distribution channels 140 further includes an arcuate gas feed channel 236 subtending 180 degrees of arc between a pair of ends 236-1 and 236-2. The ends 236-1 and 236-2 are coupled to axial gas passages 237-1 and 237-2. The axial gas passages 237-1 and 237-2 extend to top surface 110b of the annular lid plate 110, and are visible in the top view of FIG. 2 as openings in the top surface 110b. These openings are coupled to radially outward ends 154-1 and 156-1 of the gas conduits 154 and 156, respectively (FIG. 1B). The flow transition element 234 provides a connection from the outlet end 232-2 of the gas distribution channel 232 to a middle zone 236-3 of the arcuate gas feed channel 236.

Figure 3B:
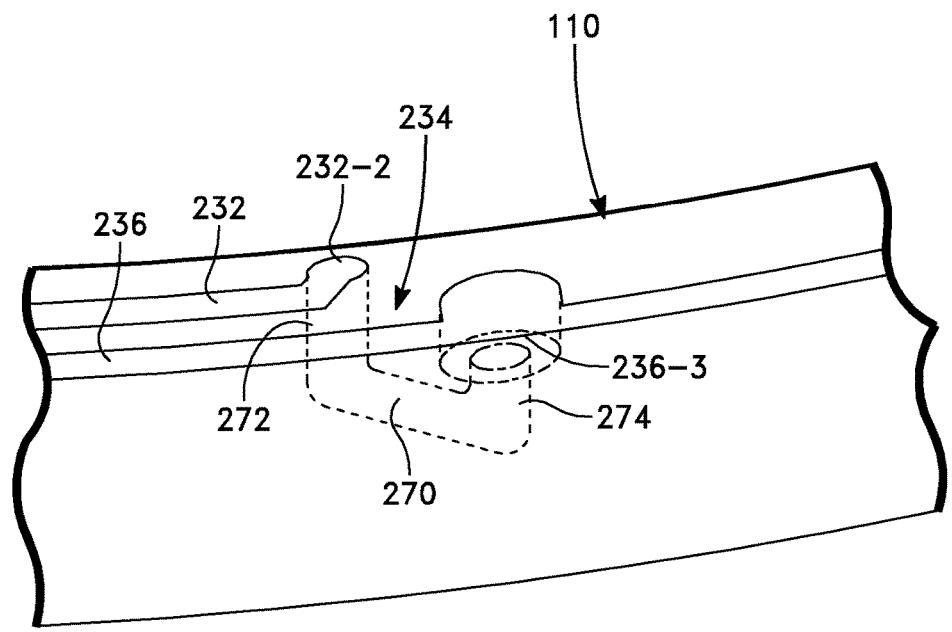
FIG. 3B is a cross-sectional view along lines 3B-3B of FIG. 3A.

Referring to FIG. 3B, the flow transition element 234 includes a radial transition conduit 270 beneath the outlet end 232-2. An axial input conduit 272 is coupled between the outlet end 232-2 of the gas supply channel 232 and one end of the radial transition conduit 270. An axial output conduit 274 is coupled between the middle zone 236-3 of the gas feed channel 236 and the other end of the radial transition conduit 270. The axial input conduit 272 meets an opening in the bottom of the outlet end 232-2 of the gas supply channel 232. The axial output conduit 274 meets an opening in the bottom of the middle zone 236-3 of the gas feed channel 236.

As shown in FIGS. 2 and 3A, the upper and lower groups of gas channels 130, 140 are virtually mirror images of one another, for virtually identical gas flow characteristics, providing optimum uniformity in one embodiment. This is facilitated by disposing the upper and lower groups of gas channels 130, 140 in different (upper and lower) planes, avoiding space occupancy conflicts between the two groups of gas channels. This latter feature permits the location of the gas delivery block 124 to be chosen without constraints from possible space conflicts between the two groups of channels. Maximum symmetry is realized by locating the gas delivery block 124, including the upper and lower gas inlets 162 and 164, along the circular periphery of the annular lid plate 110 at a location that is offset by about 45 degrees from the end 136-1 of the gas distribution channel 136, and by about 45 degrees from the end 236-1 of the gas distribution channel 236. An advantage of this feature in one embodiment is that the gas supply channel 132 in the upper group and the gas supply channel 232 in the lower group are of the same length. The path lengths of the gas distribution channels 136 and 236 are the same, and the path lengths of the upper and lower groups of gas channels 130, 140 are the same, for optimum uniformity. By providing equal path lengths to the axial gas passages 137-1, 137-2, 237-1 and 237-2, a uniform distribution of gas flow rate is realized, permitting the user to adjust gas flow rates without being affected by built-in non-uniformities among the gas distribution channels.

The disposition of the upper and lower groups of gas channels 130, 140 in different planes allows the gas channels to overlie one another, thereby reducing the annular area of the annular lid plate 110. This feature increases the diameter of the central opening 110a (FIG. 1A), enlarging the area of the dielectric window 112 for a given chamber diameter.

Figure 7:
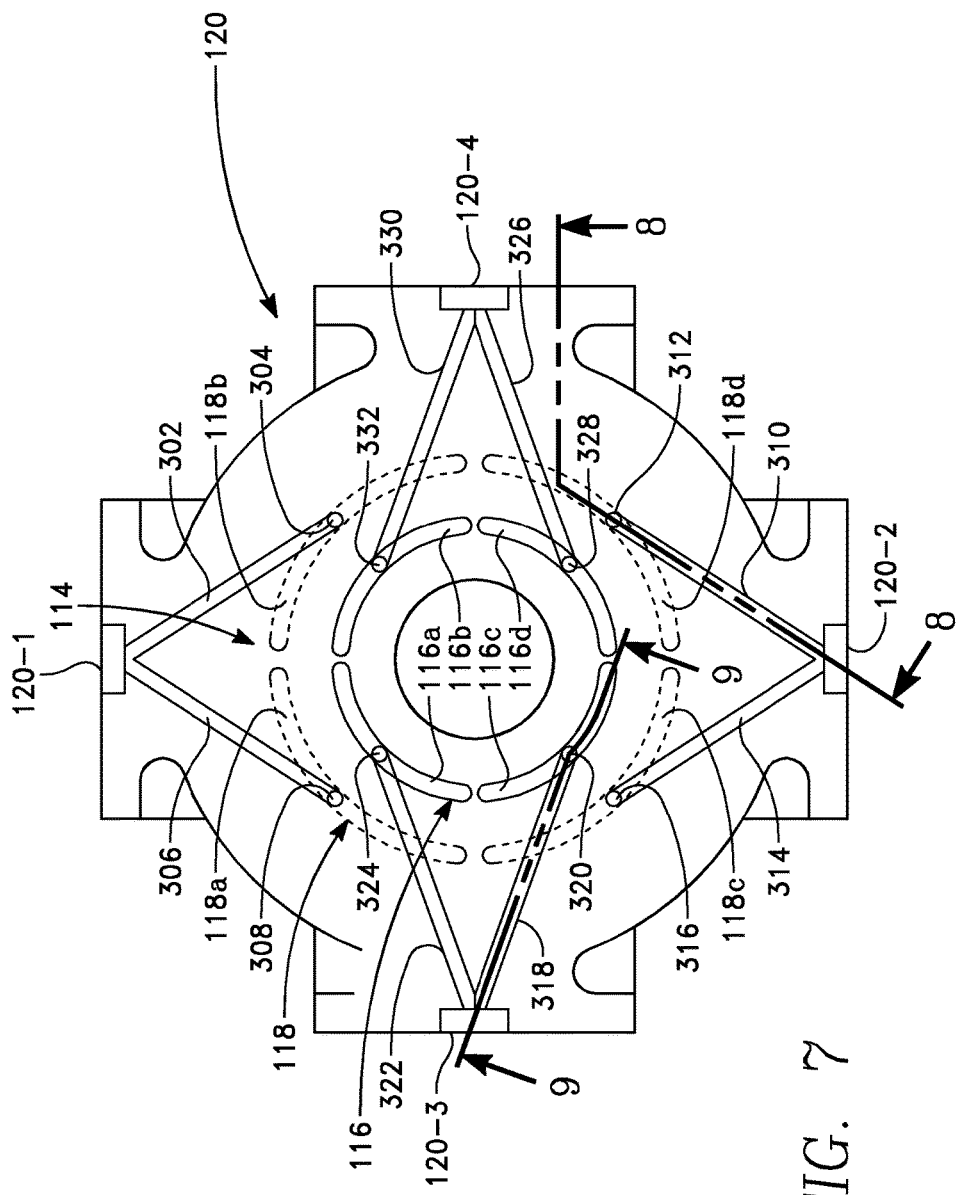
FIG. 7 is a cut-away plan view of a gas delivery hub of the embodiment of FIG. 1.
Figure 8:
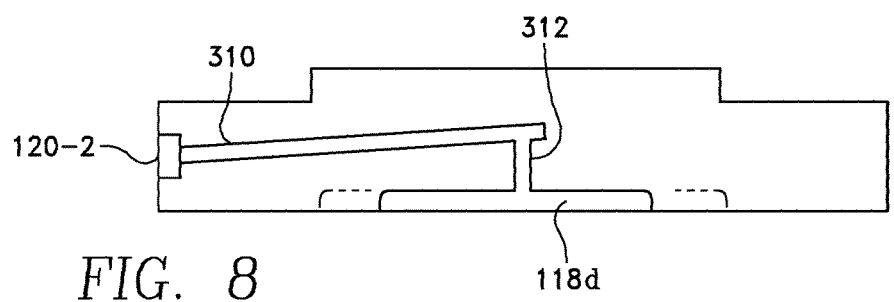
FIG. 8 is a cut-away cross-sectional view taken along lines 8-8 of FIG. 7.
Figure 9:
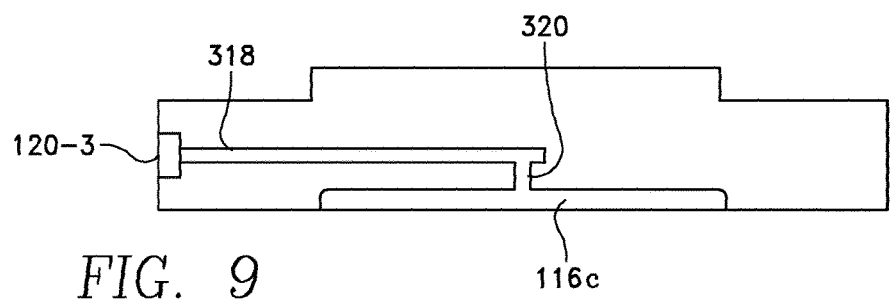
FIG. 9 is a cut-away cross-sectional view taken along lines 9-9 of FIG. 7.

Referring now to FIGS. 7, 8 and 9, the gas distribution hub 120 provides gas flow paths from the gas supply ports 120-1 and 120-2 to the annular outer gas injection passage 118 of the tunable nozzle 114. The gas distribution hub 120 also provides gas flow paths from the gas supply ports 120-3 and 120-4 to the annular inner gas injection passage 116 of the tunable nozzle 114. In one embodiment, each of the inner and outer gas injection passages 116, 118 may form a complete circle or annulus. However, as depicted in FIG. 7, the annular inner gas injection passage 116 may be divided into four sections 116a, 116b, 116c and 116d, while the annular outer gas injection passage 118 may be divided into four sections 118a, 118b, 118c and 118d.

Gas flow to the gas supply port 120-1 is split between a pair of radial elevated feed lines 302 and 306 that feed axial drop lines 304 and 308 respectively. The radially inward ends of the radial elevated feed lines 302 and 306 are elevated above the top of the annular outer gas injection passage 118. Gas flow to the gas supply port 120-2 is split between a pair of radial elevated feed lines 310 and 314 that feed axial drop lines 312 and 316 respectively. The radially inward ends of the radial elevated feed lines 310 and 314 are elevated above the top of the annular outer gas injection passage 118.

The four axial drop lines 304, 308, 312 and 316 terminate at four uniformly spaced locations along the annular outer gas injection passage 118. The four axial drop lines 304, 308, 312 and 316 are elongate enclosed hollow lines. In one embodiment, each of the four axial drop lines 304, 308, 312 and 316 is cylindrical and defines a hollow center passage.

Gas flow to the gas supply port 120-3 is split between a pair of radial elevated feed lines 318 and 322 that feed axial drop lines 320 and 324 respectively. The radially inward ends of the radial elevated feed lines 318 and 322 are elevated above the top of the annular inner gas injection passage 116. Gas flow to the gas supply port 120-4 is split between a pair of radial elevated feed lines 326 and 330 that feed axial drop lines 328 and 332 respectively. The radially inward ends of the radial elevated feed lines 326 and 330 are elevated above the top of the annular inner gas injection passage 116. The four axial drop lines 320, 324, 328 and 332 terminate at four uniformly spaced locations along the annular inner gas injection passage 116. The four axial drop lines 320, 324, 328 and 332 are elongate enclosed hollow lines. In one embodiment, each of the four axial drop lines 320, 324, 328 and 332 is cylindrical and defines a hollow center passage.

A problem solved by the embodiment of FIGS. 7-9 may be understood by reference to FIG. 7. In FIG. 7, it is apparent that if the gas delivery lines 310, 314, 318 and 322 were not elevated but instead directly fed corresponding ones of the annular inner and outer gas injection passages 116 and 118, gas flow would be predominantly along a single rotational direction at each injection point. Thus for example, gas flow from the feed line 310 to the annular outer gas injection passage 118 would be in the counter clockwise direction at the intersection or feed point. Moreover, gas flow from the feed line 314 to the annular outer gas injection passage 118 would be in the opposite (clockwise) direction at the intersection or feed point. In this example, there would be little gas flow to the section(s) of the annular outer gas injection passage 118 between the gas feed lines 310 and 314, leading to non-uniformity.

This problem is solved in one embodiment by the provision of the axial drop lines 304, 308, 312 and 316 to the annular outer gas injection passage 118 and the axial drop lines 320, 324, 328 and 332 to the annular inner gas injection passage 116. Each axial drop line transforms a distribution of gas flow momentum confined to a single direction (as received from an elevated gas feed line) to a distribution evenly divided between clockwise and counter clockwise directions at an injection point in the corresponding annular gas injection passage (116 or 118), for a more uniform gas flow distribution.

While the foregoing is directed to embodiments of the present invention, other and further embodiments of the invention may be devised without departing from the basic scope thereof, and the scope thereof is determined by the claims that follow.

What is claimed is:

1. An annular lid plate for a plasma reactor, comprising:
first and second pluralities of gas outlets, the gas outlets in each of said first and second pluralities of gas outlets being spaced apart by a first arc length;
a gas delivery block comprising first and second gas supply passages;
first and second pluralities of gas distribution channels in respective upper and lower levels, each of said first and second pluralities of gas distribution channels comprising:
an arcuate gas delivery channel having a pair of ends connected to a corresponding pair of said gas outlets; and
an arcuate gas supply channel comprising an input end connected to a corresponding one of said first and second gas supply passages, and an output end coupled to a middle zone of said arcuate gas delivery channel, the arcuate gas supply channel connected to said first gas supply passage extending in a first direction from the input end at said gas delivery block around said annular lip plate and the arcuate gas supply channel connected to said second gas supply passage extending in an opposite second direction from the input end at said gas delivery block around said annular lid plate.

2. The annular lid plate of claim 1 wherein said gas delivery block is disposed at a location that is offset from the output end of each gas supply channel by a second arc length such that gas supply channels of said first and second pluralities of gas distribution channels are of equal lengths.

3. The annular lid plate of claim 1 wherein the gas outlets of said first and second pluralities of gas outlets are distributed with respect to a circumference of said annular lid plate, and wherein said first plurality of gas outlets alternates with said second plurality of gas outlets along said circumference.

4. The annular lid plate of claim 1 wherein said first plurality of gas outlets comprises a first pair of gas outlets and said first arc length corresponds to a half circle, and said second plurality of gas outlets comprises a second pair of gas outlets offset from said first pair of gas outlets by a quarter circle.

5. The annular lid plate of claim 4 wherein said gas delivery block is disposed at a location that is offset from the output end of each of the gas supply channels by an arc length of 45 degrees.

6. The annular lid plate of claim 1 wherein each of said first and second pluralities of gas distribution channels further comprises a flow transition element connected between said output end of said gas supply channel and said middle zone of said gas delivery channel.

7. The annular lid plate of claim 6 wherein said flow transition element comprises:
a radial transition conduit displaced axially relative to said gas supply channel;
an axial input conduit coupled between said output end of said gas supply channel and one end of said radial transition conduit; and
an axial output conduit connected between said middle zone of said gas delivery channel and another end of said radial transition conduit.

8. The annular lid plate of claim 7 wherein said axial input conduit meets an opening in said output end of said gas supply channel, and said axial output conduit meets an opening in said middle zone of said gas delivery channel.

9. A gas delivery system for a plasma reactor chamber, comprising:
a gas nozzle comprising respective inner and outer gas injection passages;
an annular lid plate defining a central opening positioned radially outward of and extending angularly around said gas nozzle and comprising:
first and second pluralities of gas outlets coupled to respective ones of said inner and outer gas injection passages of said nozzle, the gas outlets in each of said first and second pluralities of gas outlets being spaced apart by a first arc length;
a gas delivery block comprising first and second gas supply passages;
first and second pluralities of gas distribution channels in respective upper and lower levels, each of said first and second pluralities of gas distribution channels comprising:
an arcuate gas delivery channel having a pair of ends connected to a corresponding pair of said gas outlets; and
an arcuate gas supply channel comprising an input end connected to a corresponding one of said first and second gas supply passages, and an output end coupled to a middle zone of said arcuate gas delivery channel.

10. The gas delivery system of claim 9 wherein said gas delivery block is disposed at a location that is offset from the output end of each gas supply channel by a second arc length such that gas supply channels of said first and second pluralities of gas distribution channels are of equal lengths.

11. The gas delivery system of claim 9 wherein the gas outlets of said first and second pluralities of gas outlets are distributed with respect to a circumference of said annular lid plate, and wherein said first plurality of gas outlets alternates with said second plurality of gas outlets along said circumference.

12. The gas delivery system of claim 9 wherein said first plurality of gas outlets comprises a first pair of gas outlets and said first arc length corresponds to a half circle, and said second plurality of gas outlets comprises a second pair of gas outlets offset from said first pair of gas outlets by a quarter circle.

13. The gas delivery system of claim 12 wherein said gas delivery block is disposed at a location that is offset from the output end of each of the gas supply channels by an arc length of 45 degrees.

14. The gas delivery system of claim 9 wherein each of said first and second pluralities of gas distribution channels further comprises a flow transition element connected between said output end of said gas supply channel and said middle zone of said gas delivery channel.

15. The gas delivery system of claim 14 wherein said flow transition element comprises:
a radial transition conduit axially displaced relative to said gas supply channel;
an axial input conduit coupled between said output end of said gas supply channel and one end of said radial transition conduit; and
an axial output conduit connected between said middle zone of said gas delivery channel and another end of said radial transition conduit.

16. The gas delivery system of claim 15 wherein said axial input conduit meets an opening in said outlet end of said gas supply channel, and said axial output conduit meets an opening in said middle zone of said gas feed channel.

17. The gas delivery system of claim 9 wherein said gas nozzle comprises:
a first plurality of radial elevated feed lines having respective input ends coupled to respective ones of said first plurality of gas outlets and respective output ends overlying inner gas injection passages;
a second plurality of radial elevated feed lines having respective input ends coupled to respective ones of said second plurality of gas outlets and respective output ends overlying inner outer gas injection passages;
a first plurality of axial drop lines connected between said respective output ends and said inner gas injection passages;
a second plurality of axial drop lines connected between said respective output ends and said outer gas injection passages.

18. The gas delivery system of claim 17 wherein:
said first plurality of axial drop lines intersect said inner gas injection passage at respective drop points evenly spaced along said inner gas injection passage;
said second plurality of axial drop lines intersect said outer gas injection passage at respective drop points evenly spaced along said outer gas injection passage.

19. The gas delivery system of claim 17 further comprising:
a first plurality of supply ports evenly spaced around a periphery of said gas nozzle and connected to respective ones of said first plurality of gas outlets;
a second plurality of supply ports evenly spaced around a periphery of said gas nozzle and connected to respective ones of said second plurality of gas outlets, and offset from said first plurality of gas supply ports;

wherein said first plurality of supply ports are connected to respective pairs of said first plurality of radial elevated feed lines, and said second plurality of supply ports are connected to respective pairs of said second plurality of radial elevated feed lines.

20. The gas delivery system of claim 19 further comprising:
- a first plurality of radial gas delivery conduits connected between respective ones of said first plurality of gas outlets and said first plurality of supply ports;
- a second plurality of radial gas delivery conduits connected between respective ones of said second plurality of gas outlets and said second plurality of supply ports.

* * * * *